United States Patent
Houbre et al.

(10) Patent No.: US 9,245,697 B2
(45) Date of Patent: Jan. 26, 2016

(54) DEVICE FOR DETECTING RESETTING OF A CIRCUIT BREAKER, ACTUATOR OF A SEPARATING MECHANISM OF THE CIRCUIT BREAKER CONTACTS, ELECTRIC CIRCUIT BREAKER AND USE OF AN INDUCED CURRENT TO GENERATE A RESETTING INDICATION SIGNAL

(71) Applicant: SCHNEIDER ELECTRIC INDUSTRIES SAS, Rueil-Malmaison (FR)

(72) Inventors: Pascal Houbre, Jarrie (FR); Fabien Odille, Grenoble (FR)

(73) Assignee: SCHNEIDER ELECTRIC INDUSTRIES SAS, Rueil-Malmaison (FR)

(*) Notice: Subject to any disclaimer, the term of this patent is extended or adjusted under 35 U.S.C. 154(b) by 0 days.

(21) Appl. No.: 14/302,843

(22) Filed: Jun. 12, 2014

(65) Prior Publication Data
US 2015/0015347 A1 Jan. 15, 2015

(30) Foreign Application Priority Data

Jul. 9, 2013 (FR) ..................................... 13 56745

(51) Int. Cl.
*G08B 21/00* (2006.01)
*H01H 3/28* (2006.01)
(Continued)

(52) U.S. Cl.
CPC .............. *H01H 3/28* (2013.01); *G01R 19/0092* (2013.01); *H01F 7/1615* (2013.01); *H01H 9/54* (2013.01);
(Continued)

(58) Field of Classification Search
CPC ..... H01F 7/1615; H01F 7/122; H01F 7/1646; H01F 2007/1692; H01F 7/126; H01F 7/1623; H01F 7/1872; H01H 33/6662; H01H 51/2209; H01H 50/03; H01H 3/28; H01H 9/54; H01H 71/04; H01H 71/2454; F01L 2013/0052; F01L 13/0036; F01L 2820/01; F01L 2820/031; G01R 19/0092
USPC ........... 340/870.18, 638; 361/42, 89, 94, 115; 335/131, 177, 220, 229, 232
See application file for complete search history.

(56) References Cited

U.S. PATENT DOCUMENTS 3,218,610 A * 11/1965 Brown ..................... 340/870.18
3,278,825 A * 10/1966 Haas, Jr. ........................... 363/2
(Continued)

FOREIGN PATENT DOCUMENTS

AU    2010327027 A1 *  6/2012
CA    2569339 A1 *  6/2007
(Continued)

OTHER PUBLICATIONS

French Preliminary Search Report issued Feb. 26, 2014, in French Application No. 13 56745 filed Jul. 9, 2013 (with English Translation of Categories of Cited Documents).

*Primary Examiner* — Kerri McNally
(74) *Attorney, Agent, or Firm* — Oblon, McClelland, Maier & Neustadt, L.L.P.

(57) ABSTRACT

A detection device that detects resetting of an electric circuit breaker. The electric circuit breaker comprises fixed and moving contacts, the moving contact being movable between an open position and a closed position, a mechanism for separating the contacts, a lever for resetting the mechanism from the open position to the closed position of the moving contact, and an actuator for actuating the separator mechanism, the actuator including an electromagnetic coil and a core movable between an idle position and a working position in which the separating mechanism is actuated, the coil causing the moving core to move from idle position to working position. The detection device may comprise means to generate a resetting indication signal from an electric pulse corresponding to an electric current induced in the coil by the movement of the moving core from its working position to its idle position during resetting of the circuit breaker.

8 Claims, 3 Drawing Sheets

(51) Int. Cl.
  *H01H 9/54* (2006.01)
  *H01F 7/16* (2006.01)
  *H01H 71/04* (2006.01)
  *G01R 19/00* (2006.01)
  *H01H 71/24* (2006.01)
  *H01H 71/50* (2006.01)
  *H01F 7/18* (2006.01)

(52) U.S. Cl.
  CPC ........... *H01H 71/04* (2013.01); *H01H 71/2454* (2013.01); *H01F 2007/185* (2013.01); *H01H 71/2463* (2013.01); *H01H 71/50* (2013.01); *H01H 2071/048* (2013.01)

(56) References Cited

U.S. PATENT DOCUMENTS

| | | | | |
|---|---|---|---|---|
| 3,392,238 | A * | 7/1968 | Lender | 375/284 |
| 3,806,846 | A * | 4/1974 | Powell | 335/20 |
| 3,828,288 | A * | 8/1974 | Boyd | 335/234 |
| 3,843,908 | A * | 10/1974 | Priegnitz | 361/89 |
| 3,868,614 | A * | 2/1975 | Riendeau | 337/66 |
| 4,013,926 | A * | 3/1977 | Lang et al. | 361/115 |
| 4,016,518 | A * | 4/1977 | Lang et al. | 335/7 |
| 4,448,545 | A * | 5/1984 | Pelka et al. | 374/41 |
| 4,876,521 | A * | 10/1989 | Boyd | 335/179 |
| 7,982,567 | B2 * | 7/2011 | Cartier Millon et al. | 335/229 |
| 8,176,887 | B2 * | 5/2012 | Golz et al. | 123/90.48 |
| 8,228,150 | B2 * | 7/2012 | Golz et al. | 335/282 |
| 8,493,166 | B2 * | 7/2013 | Golz et al. | 335/264 |
| 8,786,387 | B2 * | 7/2014 | Fong et al. | 335/179 |
| 8,997,702 | B2 * | 4/2015 | Popp et al. | 123/90.11 |
| 2004/0093718 | A1 * | 5/2004 | Takeuchi et al. | 29/602.1 |
| 2004/0201441 | A1 * | 10/2004 | Elendt et al. | 335/179 |
| 2005/0001700 | A1 * | 1/2005 | Lewis | 335/14 |
| 2005/0088265 | A1 * | 4/2005 | Nakagawa et al. | 335/220 |
| 2006/0208591 | A1 * | 9/2006 | Lee | 310/120 |
| 2007/0133140 | A1 * | 6/2007 | Vicente et al. | 361/94 |
| 2007/0171016 | A1 * | 7/2007 | Bonjean et al. | 335/234 |
| 2010/0165520 | A1 * | 7/2010 | Williams | 361/42 |
| 2011/0304417 | A1 * | 12/2011 | An | 335/234 |
| 2012/0293287 | A1 * | 11/2012 | Lauraire et al. | 335/229 |
| 2013/0207824 | A1 * | 8/2013 | Waters et al. | 341/155 |

FOREIGN PATENT DOCUMENTS

| | | | | |
|---|---|---|---|---|
| DE | 102 40 774 | A1 | 4/2003 | |
| DE | 20 2005 011 901 | U1 | 11/2006 | |
| EP | 1975960 | A1 * | 10/2008 | ............. H01H 33/66 |
| EP | 2426690 | A1 * | 3/2012 | |
| EP | 2551881 | A1 * | 1/2013 | |
| FR | 2558303 | A1 * | 7/1985 | ............. H01H 71/70 |
| FR | 2 893 445 | A1 | 5/2007 | |
| FR | 2988218 | A1 * | 9/2013 | |
| GB | 2350724 | A * | 12/2000 | ................ H01F 7/18 |
| WO | WO 0109912 | A2 * | 2/2001 | |
| WO | WO 03073456 | A1 * | 9/2003 | |

* cited by examiner

DEVICE FOR DETECTING RESETTING OF A CIRCUIT BREAKER, ACTUATOR OF A SEPARATING MECHANISM OF THE CIRCUIT BREAKER CONTACTS, ELECTRIC CIRCUIT BREAKER AND USE OF AN INDUCED CURRENT TO GENERATE A RESETTING INDICATION SIGNAL

The present invention relates to a device for detecting resetting of an electric circuit breaker.

The present invention also relates to an actuator of a separating mechanism of the fixed and moving electric circuit breaker contacts.

The present invention also relates to such an electric circuit breaker.

The present invention also relates to the use of an electric pulse associated with an induced current in a coil of such an actuator.

A detection device is known from document WO 2007/137938 A1 designed to be installed in an electric circuit breaker. The electric circuit breaker has three possible states, namely "On", "Off" and "Tripped" states, the transition from the "On" state to the "Tripped" state corresponding to the tripping of the circuit breaker, done automatically when an electric fault is detected, such as a short circuit. The electric circuit breaker includes a housing on which an actuating lever is mounted, pivotably or rotatably, the lever being rotatably movable between three positions respectively corresponding to the three states of the circuit breaker.

The detection device makes it possible to detect the state of the circuit breaker from among the three possible states, and includes a small translatable plate, mechanically coupled to the circuit breaker lever and capable of assuming three positions corresponding to the three states of the circuit breaker. The small moving plate bears a magnetic device with one or two permanent magnets, designed to actuate micro-switches between their two positions.

However, such a detection device is relatively expensive, and must be mechanically coupled to the circuit breaker lever.

The aim of the invention is therefore to propose a device for detecting resetting of the circuit breaker that is easier to implement, while being less expensive.

To that end, the invention relates to a detection device comprising means to generate a resetting indicator signal from an electric pulse, the electric pulse corresponding to an electric current induced in the coil by the movement of the moving core from its working position to its idle position during resetting of the circuit breaker.

The detection device according to the invention makes it possible to detect circuit breaker resetting without using a position sensor coupled to the circuit breaker lever.

According to other advantageous aspects of the invention, the detection device comprises one or more of the following features, considered alone or according to any technically possible combinations:
  the generating means comprise a stage for filtering the electric pulse,
  the filtering stage preferably including a capacitor and a resistance connected in parallel;
  the generating means comprise a stage for converting the electric pulse into a square signal;
  the generating means further comprise a differential amplification stage connected between the filtering stage and the conversion stage; and
  the conversion stage includes a comparator with a reference voltage.

The invention also relates to an actuator of a mechanism for separating fixed and moving electric circuit breaker contacts, the circuit breaker comprising the fixed and moving contacts, the moving contact being capable of moving between an open position, in which the fixed and moving contacts are separated, and a closed position, in which the moving contact is pressed against the fixed contact, the mechanism for separating the contacts and a lever for resetting the mechanism from the open position to the closed position of the moving contact, the actuator including an electromagnetic coil and a core movable between an idle position and a working position in which the separating mechanism is actuated, the coil being capable of causing the moving core to move from its idle position to its working position, wherein the actuator further comprises a device as defined above for detecting resetting of the circuit breaker.

The invention also relates to an electric circuit breaker comprising fixed and moving contacts, the moving contact being capable of moving between an open position, in which the fixed and moving contacts are separated, and a closed position, in which the moving contact is pressing against the fixed contact, a mechanism for separating the contacts, a lever for resetting the mechanism from the open position to the closed position of the moving contact, and an actuator of the separating mechanism, in which the actuator is as defined above.

The invention also relates to the use of an electric pulse corresponding to an electric current induced in a coil of an actuator of a mechanism for separating fixed and moving contacts of an electric circuit breaker, to generate a resetting indicator signal of the circuit breaker, the current being induced in the coil by the movement of a moving core from its working position to its idle position when the circuit breaker is reset, the moving core being included in the actuator.

These features and advantages of the invention will appear upon reading the following description, provided solely as a non-limiting example, and done in reference to the appended drawings, in which.

Figure 4:
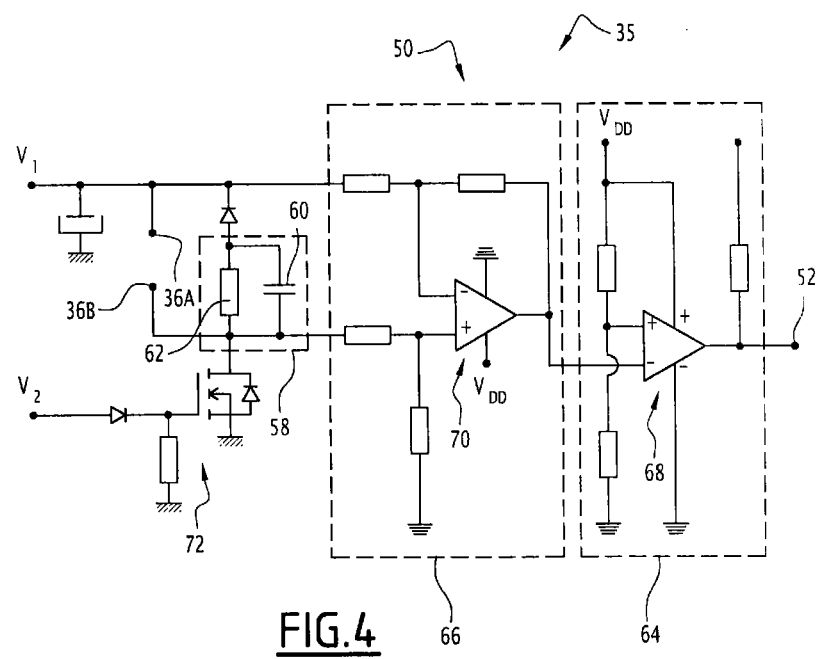
Figure 5:
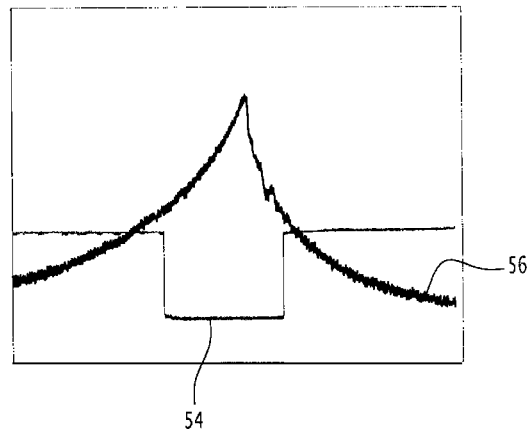
Figure 6:
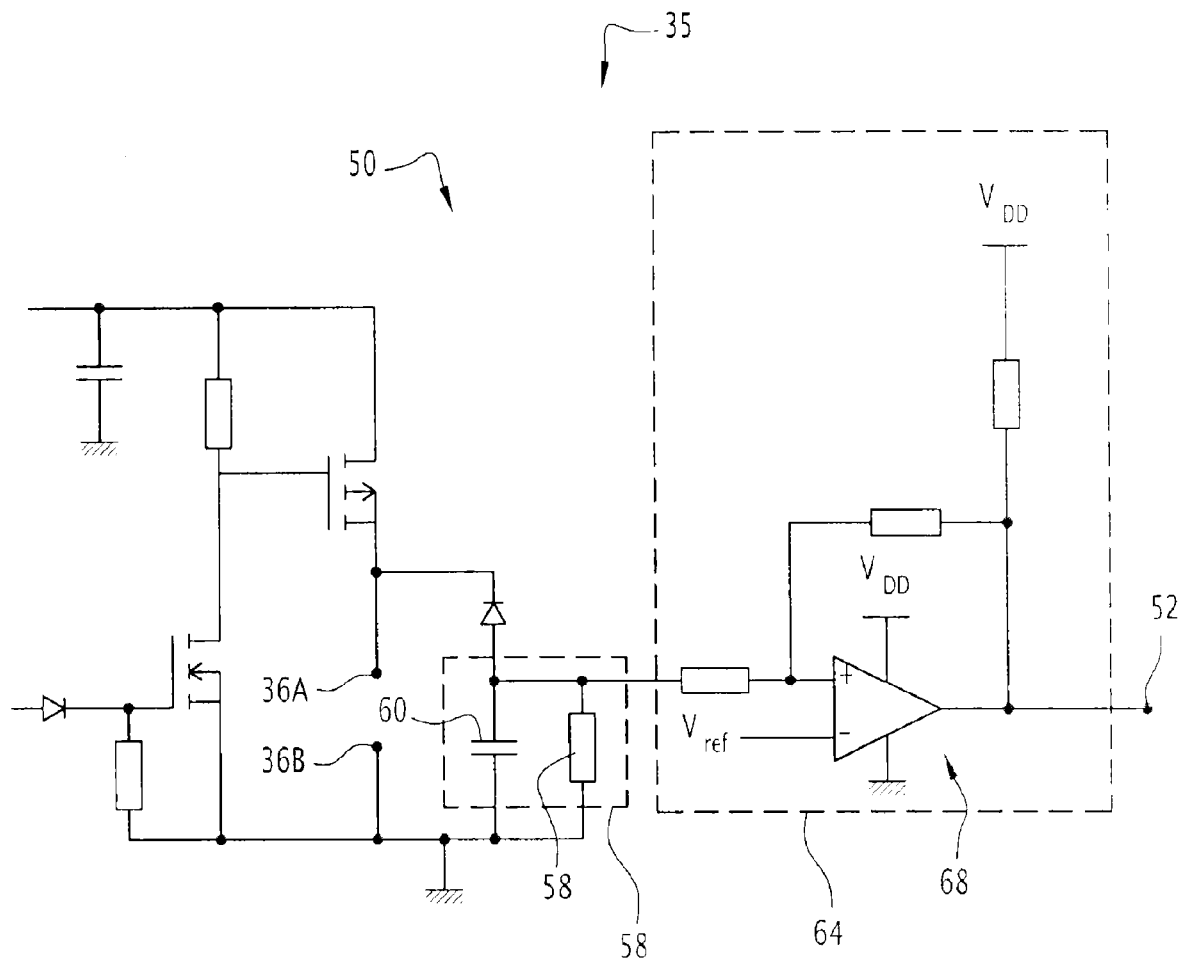

FIG. 4 is an electrical diagram of the detection device according to a first embodiment of the invention, the detection device including means for generating a signal indicating circuit breaker resetting from an electric pulse, the electric pulse corresponding to an electric current induced in the coil by the movement of the moving core from its working position to its idle position during circuit breaker resetting;

FIG. 5 is a set of curves respectively showing the electric pulse and the generated indication signal; and FIG. 6 is a view similar to that of FIG. 4 according to a second embodiment of the invention.

Figure 1:
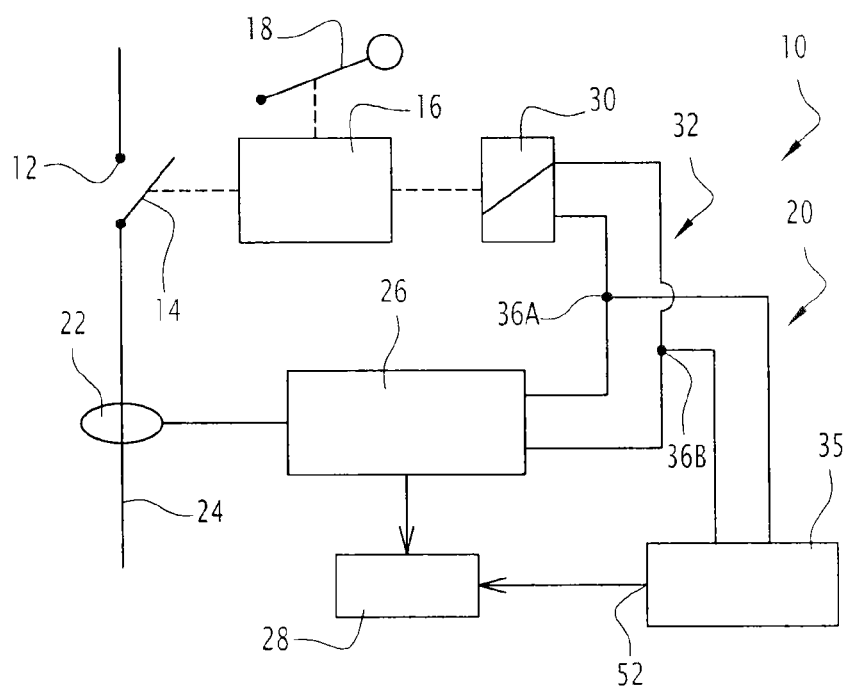
FIG. 1 is a diagrammatic illustration of a circuit breaker according to the invention, the circuit breaker including fixed and moving contacts, a mechanism for separating the contacts and an actuator for the separating mechanism.

In FIG. 1, an electric circuit breaker 10 comprises, as is known in itself, a fixed electrical contact 12 and a moving electrical contact 14, the moving contact 14 being capable of moving between an open position, in which the fixed and moving contacts 12, 14 are separated, and a closed position, in which the moving contact 14 is pressed against the fixed contact 12.

The electric circuit breaker 10 comprises a mechanism 16 for separating the contacts, a lever 18 for resetting the mechanism from the open position to the closed position of the moving contact, and an actuator 20 for the separating mechanism, the reset lever 18 and the actuator 20 each being mechanically coupled to the separating mechanism 16.

The electric circuit breaker 10 comprises a sensor 22 for the current circulating in an electrical conductor 24 connected to the fixed contact 12. The electric circuit breaker 10 comprises a processing unit 26 connected to the current sensor 22, the processing unit 26 being capable of commanding the tripping of the electric circuit breaker, i.e., the separation of the contacts 12, 14, via the actuator 20 and the separating mechanism 16, following the detection of an electric fault using the current sensor 22.

The electric circuit breaker 10 comprises a signal unit 28 connected to the processing unit 26 and intended to signal the state of the electric circuit breaker 10 to an external electronic device, not shown, the signal unit 28 being connected to the external device, for example via a wireless link.

The separating mechanism 16 is capable of securing the contacts 12, 14, when it is actuated by the actuator 20. In other words, the separating mechanism is capable of causing the moving contact 14 to go from the closed position to the open position.

The reset lever 18 is capable of resetting the separating mechanism 16, i.e., of causing the moving contact 14 to go from the open position to the closed position, via the separating mechanism 16. The reset lever 18 is for example actuated manually. One then more generally talks about resetting the circuit breaker 10.

The actuator 20 comprises a trip relay 30 on the one hand connected to the processing unit 26 by a data link 32, and on the other hand mechanically coupled to the separator mechanism 16. The actuator 20 also comprises a device 35 for detecting circuit breaker resetting, the detection device 35 being coupled to the data link 32 at connection points 36A, 36B.

The current sensor 22 includes a toroid arranged around the electric conductor 24 and capable of measuring the intensity of the current circulating in the electric conductor.

The processing unit 26 is capable of detecting an electric fault, such as a short circuit, on the electric conductor 24, in particular using the intensity measured by the current sensor 22, and commanding the tripping of the circuit breaker 10 when such a fault is detected. The processing unit 26 is then capable of generating a command signal commanding the separation of the contacts 12, 14 and sending it to the trip relay 30 via the data link 32.

The signal unit 28 is capable of transmitting information relative to the circuit breaker to the external device, the transmitted information in particular including the state of the circuit breaker, the position of the moving contact 12 among its open position and its closed position, the detection of any fault on the electric conductor 24, etc.

Figures 2, 3:
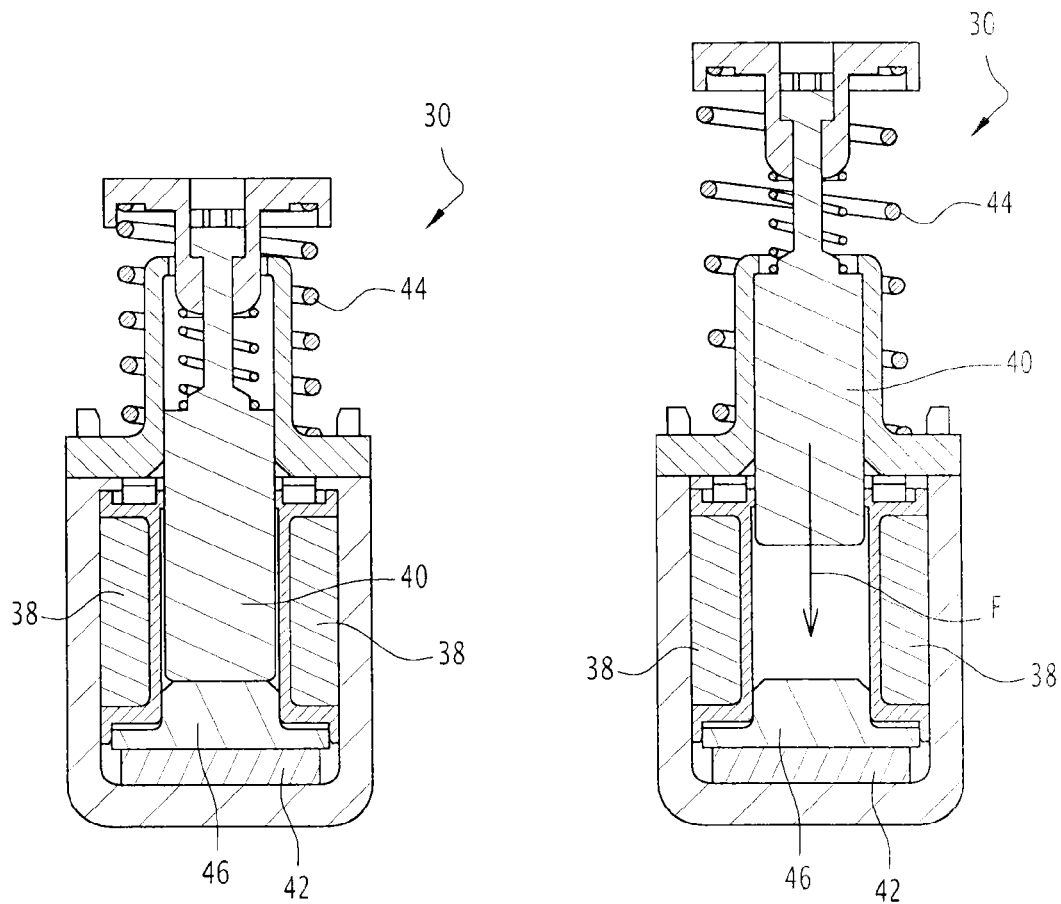
FIGS. 2 and 3 are cross-sectional views of the actuator of FIG. 1, the actuator including an electromagnetic coil, a core movable between an idle position and a working position in which the separating mechanism is actuated, and a device for detecting circuit breaker resetting, the core being in the idle position in FIG. 2 and in the working position in FIG. 3.

The trip relay 30, shown in FIGS. 2 and 3, includes an electromagnetic coil 38 and a core 40 movable between an idle position and a working position in which the separating mechanism 16 is actuated, the coil 38 being capable of causing the moving core 40 to move from its idle position to its working position.

The trip relay 30 includes a permanent magnet 42 capable of exerting an attraction force on the moving core 40, the latter preferably being made from a magnetic material. The trip relay 30 includes a spring 44 capable of exerting a propulsion force on the moving core 40, that propulsion force opposing the attraction force of the permanent magnet 42 on said core.

The trip relay 30 is a relay with a permanent magnet kept in the armed position by the magnetic force of the magnet 42, which exceeds the propulsion force of the spring 44, the relay entering the tripped position when a current circulates in the coil 38 and creates a magnetic flow opposite the magnetic flow of the permanent magnet 42.

In the armed position of the relay 30, the moving core 40 is in contact with the permanent magnet 42, a spacer 46 optionally being positioned between the moving core 40 and the permanent magnet 42, as shown in FIG. 2.

In the tripped position of the relay 30, the moving core 40 is separated from the permanent magnet 42, the propulsion force of the spring 44 added to the flow created by the coil 38 having caused the separation of the moving core 40 relative to the permanent magnet 42, as shown in FIG. 3.

The transition from the tripped position to the armed position of the relay 30 (arrow F), during resetting of the electric circuit breaker 10, creates an induced electric current in the coil 38.

According to the invention, the detection device 35 comprises means 50 for generating, in an output terminal 52, a signal 54 indicating resetting from an electric pulse 56, as shown in FIG. 4, the indicator signal 54 and the electric pulse 56 being shown in FIG. 5.

The generating means 50, shown in FIG. 4, include a stage 58 for filtering the electric pulse, the filtering stage 58 preferably including a capacitor 60 and a resistance 62 connected in parallel.

The generating means 50 include a stage 64 for converting the electric pulse 56 into a square signal, also called a window signal, corresponding to the indicator signal 54.

Additionally, in the example embodiment of FIG. 4, the generating means 50 further include a differential amplification stage 66 connected between the filtering stage 58 and the conversion stage 64.

The output terminal 52 is for example connected to the signal unit 28, for transmission of the indicator signal 54 to the signal unit 28.

The indicator signal 54 is for example a square signal, as shown in FIG. 5, such as a square signal, easily identifiable by the signal unit 28.

The electric pulse 56 corresponds to the electric current induced in the coil 38 by the movement of the moving core 40 from its working position to its idle position during resetting of the circuit breaker 10. On the electrical diagram of FIG. 4, the electric pulse 56 corresponds to the voltage $V_1$, i.e., the voltage at the connection point 36A.

The filtering stage 58 is connected between the connection points 36A, 36B, and is in turn connected to the input of the differential amplification stage 66.

The conversion stage 64 for example includes a first operational amplifier 68 whereof one of the input terminals is at a reference voltage $V_{DD}$ and the other input terminal is connected to the output of the differential amplification stage 66, the output terminal of the operational amplifier 68 being connected to the output terminal 52. The first operational amplifier 68 forms a comparator for comparing the electric pulse 56 received as input with the reference voltage $V_{DD}$.

The differential amplification stage 66 for example includes a second operational amplifier 70, one of the input terminals of which is at the voltage $V_1$ and the other input terminal of which is connected to a command circuit 72 capable of delivering a command signal from a voltage $V_2$.

Thus, when the circuit breaker 10 is reset, for example by manually actuating the reset lever 18, the trip relay 30 goes from its tripped position to its armed position, the moving core 40 then moving in the direction of the arrow F in FIG. 3, which creates an induced electric current in the electromagnetic coil 38. The electric pulse 56 corresponding to this induced current is received by the detection device 35 between the connection points 36A, 36B.

The received electric pulse 56 is then first filtered by the filtering stage 58, before being amplified by the differential amplification stage 66, then converted by the conversion stage 64 into the reset indicator signal 54. The reset indicator signal 54 is transmitted to the signal unit 28, so that the information on the resetting of the electric circuit breaker 10 is transmitted to the external device.

The electric pulse 56 corresponding to the electric current induced in the coil 38 of the actuator 20 of the mechanism 16 for separating the fixed and moving contacts 12, 14 of the electric circuit breaker 10 is thus used to generate the signal 54 indicating resetting of the circuit breaker 10, the current being induced in the coil 38 by the movement of the moving core 40 from its working position to its idle position during resetting of the circuit breaker 10.

One can thus see that the detection device 35 according to the invention is particularly simple to implement, since it suffices to connect it between the trip relay 30 and the processing unit 26, while being inexpensive due to the absence of a position sensor.

FIG. 6 illustrates a second embodiment of the invention, for which the elements identical to the first embodiment previously described are identified using identical references.

According to the second embodiment, the generating means 50 do not include a differential amplification stage, and the filtering stage 58 is connected directly at the input of the conversion stage 64.

According to this second embodiment, the connection point 36B is referenced at the ground 80 of the electronics.

The first operational amplifier 68 of the conversion stage is connected as input, on the one hand to the output of the filtering stage 58, and on the other hand to a reference voltage $V_{ref}$, the first operational amplifier 68 being connected as output to the output terminal 52.

The operation of this second embodiment is similar to that of the first embodiment, previously described, and is not described again.

The advantages of this second embodiment similar to those of the first embodiment are not described again. The detection device 35 according to this second embodiment is further simplified, since it does not include a differential amplification stage.

One can thus see that the detection device 35 according to the invention is particularly simple to implement, while being inexpensive.

The invention claimed is:

1. A detection device for detecting resetting of a circuit breaker, the circuit breaker comprising fixed and movable contacts, wherein the movable contact is movable between an open position, in which the fixed and movable contacts are separated, and a closed position, in which the movable contact is pressed against the fixed contact, a mechanism for separating the contacts, a lever for resetting the mechanism from the open position to the closed position of the movable contact, an actuator to actuate the separating mechanism, the actuator including an electromagnetic coil and a core movable between an idle position and a working position in which the separating mechanism is actuated, the coil being configured to cause the core to move from the idle position to the working position, the detection device comprising circuitry configured to generate a resetting indication signal from an electric pulse, the electric pulse corresponding to an electric current induced in the coil by the movement of the core from the working position to the idle position during resetting of the circuit breaker.

2. The detection device according to claim 1, wherein the circuitry includes a filtering stage to filter the electric pulse, the filtering stage including a capacitor and a resistor connected in parallel.

3. The detection device according to claim 1, wherein the circuitry includes a conversion stage to convert the electric pulse into a square signal.

4. The detection device according to claim 3, wherein the circuitry includes a differential amplification stage connected between the filtering stage and the conversion stage.

5. The detection device according to claim 3, wherein the conversion stage includes a comparator supplied with a reference voltage.

6. The detection device according to claim 1, further comprising the actuator to actuate the separating mechanism for separating the fixed and movable electric circuit breaker contacts,
wherein the actuator includes:
the electromagnetic coil and the core that is movable between the idle position and the working position in which the separating mechanism is actuated, the coil being configured to cause the core to move from the idle position to the working position.

7. An electric circuit breaker comprising;
fixed and movable contacts, the movable contact being movable between an open position, in which the fixed and movable contacts are separated, and a closed position, in which the movable contact is pressed against the fixed contact,
a mechanism to separate the contacts,
a lever to reset the mechanism from the open position to the closed position of the movable contact,
an actuator of the separating mechanism, the actuator including an electromagnetic coil and a core movable between an idle position and a working position in which the separating mechanism is actuated, the coil being configured to cause the core to move from the idle position to the working position, and
a device that detects resetting of the electric circuit breaker, the device including circuitry configured to generate a resetting indication signal from an electric pulse corresponding to an electric current induced in the coil by the movement of the core from the working position to the idle position during resetting of the circuit breaker.

8. A method comprising:
providing an electric pulse corresponding to an electric current induced in a coil of an actuator of a mechanism for separating fixed and movable contacts of an electric circuit breaker, and
generating a resetting indication signal indicative of resetting of the circuit breaker,
wherein the electric current is induced in the coil by the movement of a core from a working position to an idle position when the electric circuit breaker is reset, the core being included in the actuator.

* * * * *